United States Patent
Shimizu et al.

(10) Patent No.: US 8,974,687 B2
(45) Date of Patent: Mar. 10, 2015

(54) PIEZOELECTRIC CERAMIC AND METHOD OF MANUFACTURING THE SAME

(71) Applicant: Taiyo Yuden Co., Ltd., Taito-ku, Tokyo (JP)

(72) Inventors: Hiroyuki Shimizu, Takasaki (JP); Yutaka Doshida, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 203 days.

(21) Appl. No.: 13/853,796

(22) Filed: Mar. 29, 2013

(65) Prior Publication Data

US 2013/0306901 A1 Nov. 21, 2013

(30) Foreign Application Priority Data

May 15, 2012 (JP) ................................ 2012-111877

(51) Int. Cl.
*H01L 41/083* (2006.01)
*H01L 41/187* (2006.01)
*C04B 35/495* (2006.01)
(Continued)

(52) U.S. Cl.
CPC .......... *H01L 41/1871* (2013.01); *C04B 35/495* (2013.01); *C04B 35/62685* (2013.01); *C04B 35/645* (2013.01); *C04B 2235/3201* (2013.01); *C04B 2235/3208* (2013.01); *C04B 2235/3213* (2013.01); *C04B 2235/3251* (2013.01); *C04B 2235/3255* (2013.01); *C04B 2235/3262* (2013.01); *C04B 2235/3263* (2013.01); *C04B 2235/3265* (2013.01); *C04B 2235/3418* (2013.01); *C04B 2235/6021* (2013.01); *C04B 2235/6027* (2013.01); *C04B 2235/605* (2013.01); *C04B 2235/76* (2013.01); *C04B 2235/786* (2013.01); *C04B 2235/787* (2013.01);
(Continued)

(58) Field of Classification Search
USPC ....................... 252/62.9 R; 501/135; 264/405
See application file for complete search history.

(56) References Cited

U.S. PATENT DOCUMENTS 5,954,994 A 9/1999 Kimura et al.
8,894,873 B2 * 11/2014 Doshida ................. 252/62.9 PZ
(Continued)

FOREIGN PATENT DOCUMENTS

JP H10-297969 A1 11/1998
JP H11-240759 A 9/1999
(Continued)

OTHER PUBLICATIONS

Xiujun Fan, et al.; "Structure and electrical properties of MnO-doped SrCaNaNbO lead-free piezoelectirc ceramics"; Journal of Alloys and Compounds; Mar. 20, 2011; pp. 6652-6658; vol. 509, No. 23; Elsevier Sequoia, Lausanne, CH.
(Continued)

*Primary Examiner* — Carol M Koslow
(74) *Attorney, Agent, or Firm* — Law Office of Katsuhiro Arai

(57) ABSTRACT

A piezoelectric ceramic is expressed by the composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein the degree of orientation of axis c of the polycrystal is 60% or more in Lotgering factor. The piezoelectric ceramic offers excellent temperature characteristics and supporting high-power driving.

19 Claims, 14 Drawing Sheets (a)

(b)

(c)

(51) Int. Cl.
 *C04B 35/626* (2006.01)
 *C04B 35/645* (2006.01)
 *H01L 41/43* (2013.01)

(52) U.S. Cl.
 CPC ......... *C04B2235/79* (2013.01); *C04B 2235/80* (2013.01); *C04B 2235/85* (2013.01); *H01L 41/43* (2013.01)
 USPC ..................... 252/62.9 R; 501/135; 264/405

(56) References Cited

U.S. PATENT DOCUMENTS

| | | | |
|---|---|---|---|
| 2008/0045399 A1 | 2/2008 | Takeda et al. | |
| 2013/0088119 A1 | 4/2013 | Hayashi et al. | |
| 2013/0313467 A1 | 11/2013 | Doshida | |

FOREIGN PATENT DOCUMENTS

| | | | |
|---|---|---|---|
| JP | H11-278932 A | | 10/1999 |
| JP | 2000-169229 A | | 6/2000 |
| JP | 2010-087380 A1 | | 4/2010 |
| JP | 2012-36036 | * | 2/2012 |
| JP | 2012-036036 A1 | | 2/2012 |
| WO | 2011/155633 A1 | | 12/2011 |
| WO | 2012/017855 A1 | | 2/2012 |
| WO | WO 2012/017855 | * | 2/2012 |

OTHER PUBLICATIONS

The Extended European Search Report (EESR) issued by the European Patent Office, mailed Dec. 12, 2013, for European counterpart Application No. 13001914.4.
A Notification of First Office Action issued by the State Intellectual Property Office of China, mailed Apr. 14, 2014, for Chinese counterpart application No. 201310107952.9.

* cited by examiner (a)

(b)

(a)

(b)

(c)

(a)

(b)

(c)

(a)

(b)

(c)

(a)

(b)

PIEZOELECTRIC CERAMIC AND METHOD OF MANUFACTURING THE SAME

BACKGROUND

1. Field of the Invention

The present invention relates to a piezoelectric ceramic constituted by polycrystal of tungsten bronze structure, as well as a manufacturing method thereof.

2. Description of the Related Art

Piezoelectric ceramics are used as piezoelectric elements. Piezoelectric elements are used as sensor elements and electricity generating elements, among others, by applying the piezoelectric effect of converting mechanical energy to electrical energy. Piezoelectric elements are also used as vibrators, sound generators, actuators, supersonic motors, etc., that apply the reverse-piezoelectric effect of converting electrical energy to mechanical energy. In addition, piezoelectric elements are used as circuit elements, vibration control elements, etc., by combining the piezoelectric effect and reverse-piezoelectric effect.

PZT material expressed by the composition formula Pb(Zr, Ti)$O_3$-PbTi$O_3$ and PLZT material expressed by the composition formula (Pb,La)(Zr,Ti)$O_3$-PbTi$O_3$ are widely known as high-performance piezoelectric ceramics. However, these piezoelectric ceramics contain Pb which is harmful to the human body.

Among the Pb-free piezoelectric ceramics, or piezoelectric ceramics not containing Pb, those of tungsten bronze structure are known as having relatively favorable performance (refer to Reference Literatures 1 to 6). Patent Literatures 1 to 5 study Pb-free piezoelectric ceramic compositions, while Patent Literature 6 studies crystal orientation of a Pb-free piezoelectric ceramic.

BACKGROUND ART LITERATURE

Patent Literature

[Patent Literature 1] [Patent Literature 1]Japanese Patent Laid-open No. Hei 11-240759

[Patent Literature 2] Japanese Patent Laid-open No. Hei 11-278932

[Patent Literature 3] Japanese Patent Laid-open No. 2000-169229

[Patent Literature 4] Japanese Patent Laid-open No. Hei 10-297969

[Patent Literature 5] Japanese Patent Laid-open No. 2012-036036

[Patent Literature 6] Japanese Patent Laid-open No. 2010-087380

SUMMARY

As mentioned above, applications of piezoelectric elements are wide-ranging. For this reason, piezoelectric elements are now used in various environments. Accordingly, piezoelectric ceramics are required to have stable characteristics over a wide temperature range including room temperature.

Also, desirably piezoelectric elements are usable in a wide range of vibration speeds so that various driving conditions can be supported. Particularly in recent years, piezoelectric elements capable of high-power driving are needed for supersonic motors, piezoelectric transducers, and other applications. For this reason, desirably piezoelectric elements are usable at higher vibration speeds.

Accordingly, an object of the present invention is to provide a piezoelectric ceramic offering excellent temperature characteristics and supporting high-power driving, as well as a manufacturing method thereof. In other words, the present invention can provide a piezoelectric ceramic capable of stable, efficient driving, as well as a manufacturing method thereof.

To achieve the aforementioned object, a piezoelectric ceramic pertaining to an embodiment of the present invention is expressed by the composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein the degree of orientation of axis c of the polycrystal is 60% or more in Lotgering factor.

Also, a piezoelectric ceramic pertaining to an embodiment of the present invention is expressed by the composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein the ferroelastic phase transition temperature of the polycrystal is 50° C. or above.

Also, a manufacturing method of a piezoelectric ceramic pertaining to an embodiment of the present invention comprises mixing a $SiO_2$ powder with a powder constituted by crystal of tungsten bronze structure expressed by the composition formula $(Sr_{2-x}Ca_x)_{1+y/4}Na_{1-y}Nb_{5-2/5z}Mn_zO_{15}$ (in the formula, $0 \leq x < 0.3$, $0.1 < y < 0.6$ and $0 < z < 0.1$), at a ratio of $\alpha$ mol ($1 < \alpha < 8$) of the $SiO_2$ powder to 100 mol of the powder, to prepare a mixed powder.

A magnetic field is applied to the above mixed powder to provide a molding constituted by the above crystal with orientation added.

The above molding is sintered to provide a sintered compact whose degree of orientation of axis c in the above crystal is 60% or more in Lotgering factor.

The present invention includes, but is not limited to, the following embodiments:

1. A piezoelectric ceramic expressed by a composition formula $100[(Sr_{2-x}Ca_x)_{1+y/4}Na_{1-y}Nb_{5-2/5z}Mn_zO_{15}]+\alpha SiO_2$ (in the formula, $0 < x < 0.3$, $0.1 < y < 0.6$, $0 < z < 0.1$ and $1 < \alpha < 8$) and constituted by polycrystal of tungsten bronze structure, wherein a degree of orientation of axis c of the polycrystal is 60% or more in Lotgering factor.

2. A piezoelectric ceramic expressed by a composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein a ferroelastic phase transition temperature of the polycrystal is 50° C. or above.

3. A piezoelectric ceramic according to embodiment 1 or 2, wherein a rate of change in piezoelectric constant $d_{31}$ at −40° C. or above and 150° C. or below, relative to a value at 25° C., is 40% or less.

4. A piezoelectric ceramic according to any one of embodiments 1 to 3, wherein a rate of change in electro-mechanical coefficient $k_{31}$ at −40° C. or above and 150° C. or below, relative to a value at 25° C., is 70% or less.

5. A piezoelectric ceramic according to any one of embodiments 1 or 4, wherein a rate of change in piezoelectric constant $d_{33}$ at −40° C. or above and 150° C. or below, relative to a value at 25° C., is 60% or less.

6. A piezoelectric ceramic according to any one of embodiments 1 to 5, wherein a rate of change in electro-mechanical coefficient $k_{33}$ at −40° C. or above and 150° C. or below, relative to a value at 25° C., is 30% or less.

7. A piezoelectric ceramic according to any one of embodiments 1 to 6, wherein a maximum temperature rise until a vibration speed reaches 0.62 m/s is 8° C. or less.

8. A piezoelectric ceramic according to any one of embodiments 1 to 7, wherein a maximum vibration speed is 1.6 m/s or more.

9. A piezoelectric ceramic according to any one of embodiments 1 to 8, wherein a rate of change in mechanical quality coefficient Q within a range of drivable vibration speeds is 8% or less.

10. A piezoelectric ceramic according to any one of embodiments 1 to 9, wherein a difference between maximum and minimum resonance frequencies within a range of drivable vibration speeds is 0.08% of the minimum value or less.

11. A method of manufacturing a piezoelectric ceramic, comprising: mixing a $SiO_2$ powder with a powder constituted by crystal of tungsten bronze structure expressed by a composition formula $(Sr_{2-x}Ca_x)_{1+y/4}Na_{1-y}Nb_{5-2/5z}Mn_zO_{15}$ (in the formula, $0 \leq x < 0.3$, $0.1 < y < 0.6$ and $0 < z < 0.1$), at a ratio of $\alpha$ mol ($1 < \alpha < 8$) of the $SiO_2$ powder to 100 mol of the powder, to prepare a mixed powder;

applying a magnetic field to prepare a molding of the mixed powder where orientation has been added to the crystal; and sintering the molding to prepare a sintered compact whose degree of orientation of axis c in the above crystal is 60% or more in Lotgering factor.

Any discussion of problems and solutions involved in the related art has been included in this disclosure solely for the purposes of providing a context for the present invention, and should not be taken as an admission that any or all of the discussion were known at the time the invention was made.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1:
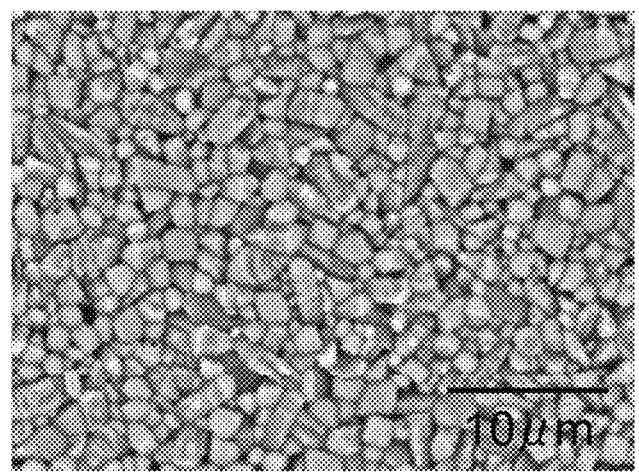
[FIG. 1] is SEM images wherein SEM image (a) shows the fine structure of a piezoelectric ceramic pertaining to an embodiment of the present invention, and SEM image (b) shows the fine structure of ceramics pertaining to a comparative example of the present invention.
Figure 1:
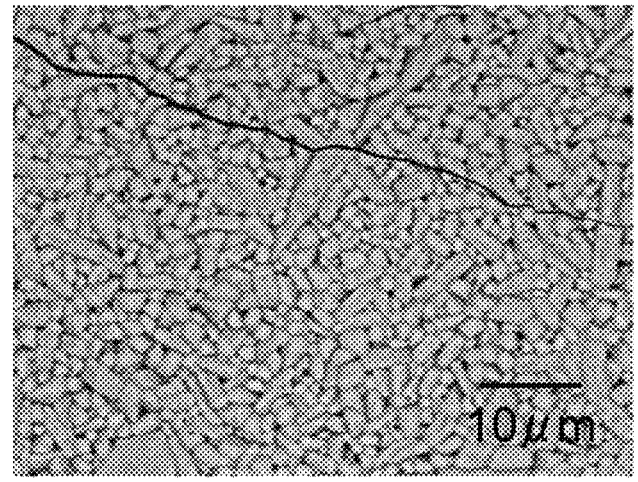

M—Tungsten bronze phase
S—$SiO_2$ phase

DETAILED DESCRIPTION OF EMBODIMENTS

A piezoelectric ceramic pertaining to an embodiment of the present invention is expressed by the composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein the degree of orientation of axis c of the polycrystal is 60% or more in Lotgering factor.

Also, a piezoelectric ceramic pertaining to an embodiment of the present invention is expressed by the composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein the ferroelastic phase transition temperature of the polycrystal is 50° C. or above.

This piezoelectric ceramic offers excellent temperature characteristics and is capable of high-power driving.

With the above piezoelectric ceramic, the piezoelectric constant $d_{31}$ may have a rate of change of 40% or less at −40° C. or above and 150° C. or below, relative to the value at 25° C. Also with the above piezoelectric ceramic, the electro-mechanical coefficient $k_{31}$ may have a rate of change of 70% or less at −40° C. or above and 150° C. or below, relative to the value at 25° C. Additionally with the above piezoelectric ceramic, the piezoelectric constant $d_{33}$ may have a rate of change of 60% or less at −40° C. or above and 150° C. or below, relative to the value at 25° C. Furthermore with the above piezoelectric ceramic, the electro-mechanical constant $k_{33}$ may have a rate of change of 30% or less at −40° C. or above and 150° C. or below, relative to the value at 25° C.

This piezoelectric ceramic offers excellent temperature characteristics.

The above piezoelectric ceramic may have a maximum rise in temperature of 8° C. or less until the vibration speed reaches 0.62 m/s. Also, the above piezoelectric ceramic may have a maximum vibration speed of 1.6 m/s or more. Additionally with the above piezoelectric ceramic, the mechanical quality coefficient Q may have a rate of change of 8% or less within a range of drivable vibration speeds. Furthermore with the above piezoelectric ceramic, the difference between the maximum and minimum resonance frequencies may be 0.08% or less of the minimum value within a range of drivable vibration speeds.

This piezoelectric ceramic is capable of high-power driving. Note that "vibration speeds" are indicated by "effective vibration speeds at resonance frequency" in units of (m/s) instead of (m/s rms) as a matter of convenience.

A manufacturing method of a piezoelectric ceramic pertaining to an embodiment of the present invention comprises mixing a $SiO_2$ powder with a powder constituted by crystal of tungsten bronze structure expressed by the composition formula $(Sr_{2-x}Ca_x)_{1+y/4}Na_{1-y}Nb_{5-2/5z}Mn_zO_{15}$ (in the formula, $0 \leq x < 0.3$, $0.1 < y < 0.6$ and $0 < z < 0.1$), at a ratio of $\alpha$ mol ($1 < \alpha < 8$) of the $SiO_2$ powder to 100 mol of the powder, to prepare a mixed powder.

A magnetic field is applied to the above mixed powder to provide a molding constituted by the above crystal with orientation added.

The above molding is sintered to provide a sintered compact whose degree of orientation of axis c in the above crystal is 60% or more in Lotgering factor.

According to this manufacturing method, a piezoelectric ceramic offering excellent temperature characteristics and supporting high-power driving can be provided.

An embodiment of the present invention is explained below by referring to the drawings.

[Study of Composition]

A Pb-free piezoelectric ceramic pertaining to this embodiment is expressed by the composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$). This piezoelectric ceramic is constituted in such a way that a $SiO_2$ phase is uniformly dispersed in a $(Sr_{2-x}Ca_x)_{1+y/4}Na_{1-y}Nb_{5-2/5z}Mn_zO_{15}$ polycrystal phase of tungsten bronze structure (hereinafter referred to as "tungsten bronze phase").

In this embodiment, firstly, production of any crystal phase other than the tungsten bronze phase (hereinafter referred to as "impurity phase") is suppressed to prevent drop in piezoelectric characteristics due to production of impurity phase. Secondly, the $SiO_2$ powder is uniformly dispersed in the tungsten bronze phase to suppress the growth of crystal grains in the tungsten bronze phase.

By keeping these in mind, an optimal composition of piezoelectric ceramics was studied.

(a) Tungsten bronze phase

In the present embodiment, the composition formula of the tungsten bronze phase is $(Sr_{2-x}Ca_x)_{1+y/4} Na_{1-y}Nb_{5-2/5z}Mn_zO_{15}$, where the conditions of x, y and z are $0 \leq x < 0.3$, $0.1 < y < 0.6$ and $0 < z < 0.1$, respectively.

The single tungsten bronze phase refers to a state where no impurity phase is contained in the tungsten bronze phase of the ceramic. Whether or not the tungsten bronze phase was a single phase was determined using the XRD (X-ray diffraction) method. To be specific, the tungsten bronze phase constituting the ceramic was determined as a single phase when the main peak intensity of any impurity phase was less than 1 compared to the main peak intensity of the tungsten bronze phase being 100. In other words, it was determined that the ceramic contained an impurity phase when the main peak intensity of the contained impurity phase was 1 or more.

Study results regarding the conditions of x, y and z in the composition formula $(Sr_{2-x}Ca_x)_{1+y/4}Na_{1-y}Nb_{5-2/5z}Mn_zO_{15}$ are explained. One representative example of the tungsten bronze phase is $Sr_2NaNb_5O_{15}$. The art illustrated by this embodiment adopts a composition obtained by partially substituting Sr with Ca and partially substituting the Nb site with Mn.

First, study results regarding the condition of z, which represents the Mn substitution amount relative to Nb, are explained. Mn-free ceramics where z=0 did not provide sufficient insulation property and using it for piezoelectric elements was difficult. On the other hand, ceramics containing Mn, even by a trace amount, provided sufficient insulation property.

Also, ceramic obtained by adjusting z to z<0.1 had a single tungsten bronze phase. On the other hand, ceramics obtained by adjusting z to z≥0.1 contained Mn-containing oxides and other impurity phases such as $Sr_{0.25}Na_{0.5}NbO_3$ whose structure is different from that of the tungsten bronze phase. Accordingly, the condition of z was set to "$0<z<0.1$" in this embodiment.

Next, study results regarding the condition of y for adjusting the ratio of (Sr,Ca) and Na are explained. In this study, the condition of z was set to "$0<z<0.1$." Ceramic obtained by adjusting y to y<0.1 or y≥0.6 contained impurity phases, representative of which was $Sr_{0.25}Na_{0.5}NbO_3$, regardless of the amount of Mn at the applicable Nb site. This ceramic cannot be polarized and using it for piezoelectric elements is difficult.

On the other hand, ceramics obtained by adjusting y to $0.1<y<0.6$ had a single tungsten bronze phase. This ceramic could be polarized. Accordingly, the condition of y was set to "$0.1<y<0.6$" in this embodiment.

Note that the condition of x, which represents the Ca substitution amount relative to Sr, was set to "$0 \leq x < 0.3$" by conforming to the art described in Patent Literature 5, etc., and validating under the aforementioned conditions of y and z.

(b) $SiO_2$ phase

In this embodiment, a $SiO_2$ powder is added by $\alpha$ mol to 100 mol of the tungsten bronze phase of $(Sr_{2-x}Ca_x)_{1+y/4}Na_{1-y}Nb_{5-2/5z}Mn_zO_{15}$ ($0 \leq x < 0.3$, $0.1 < y < 0.6$ and $0 < z < 0.1$). In this embodiment, the condition of a was set to "$1<\alpha<8$."

FIG. 1(a) is a SEM (scanning electron microscope) image showing the fine structure of ceramic obtained at "$1<\alpha<8$." The ceramic obtained at "$1<\alpha<8$" had crystal grains of uniform size and no coarse crystal grains were observed. This is the result of $SiO_2$ grains entering the crystal grain boundary (including the triple point) of the tungsten bronze structure when the ceramic was sintered, thereby suppressing the growth of crystal grains. Here, coarse crystal grains are defined as crystal grains of 15 μm or more. The average size of crystal grains in the polycrystal structure shown in FIG. 1(a) was within a range of 3 μm or above and 5 μm or below and grains of 15 μm or more were not contained. Also, no impurity phase was found in this ceramic, except for the $SiO_2$ phase.

FIG. 1(b) is a SEM image showing the fine structure of ceramics obtained at "$\alpha<1$." The ceramic obtained at "$\alpha<1$" had crystal grains of uneven sizes in the tungsten bronze phase, indicating production of coarse crystal grains. Many samples cracked due to these coarse crystal grains.

Furthermore, when the fine structure of the ceramic obtained at "$\alpha>8$" was observed with a SEM, many coarse crystal grains other than from the tungsten bronze phase were found. This is probably because excessive $SiO_2$ caused Si to cohere and segregate, resulting in lowering of the melting point of the ceramic and partial melting of the structure at the time of sintering. Accordingly, the ceramic obtained under this condition is difficult to use as a piezoelectric ceramic.

Accordingly, the condition of a was set to "$1<\alpha<8$" in this embodiment.

In this embodiment, the composition formula of the tungsten bronze phase is indicated as $(Sr_{2-x}Ca_x)_{1+y/4}Na_{1-y}Nb_{5-2/5z}Mn_zO_{15}$. In reality, however, oxygen deficiency occurs when Nb at the B site is substituted with Mn. The composition formula of the tungsten bronze phase that considers this oxygen deficiency is $(Sr_{2-x}Ca_x)_{1+y/4}Na_{1-y}Nb_{5-2/5z}Mn_zO_{15-2z}$.

Generally with a tungsten bronze phase, however, the oxygen amount does not always conform to the composition formula and the oxygen amount is known to increase or decrease slightly compared to the amount in the composition formula. In this embodiment, therefore, the oxygen amount in the tungsten bronze phase is not an exact value, but it suffices that the values of x, y, z and α meet the aforementioned conditions.

[Rough Configuration of Manufacturing Process]

Figure 2:
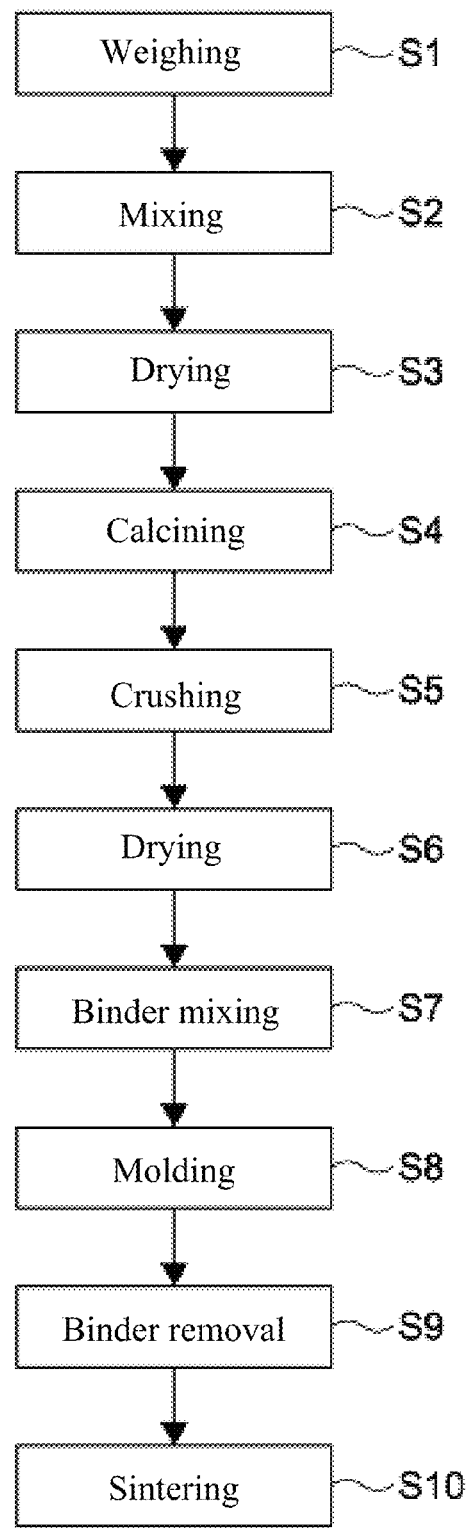
[FIG. 2] is a flow chart showing a rough configuration of the manufacturing process of a piezoelectric ceramic shown in FIG. 1(a).

FIG. 2 is a flow chart showing a rough configuration of the manufacturing process of a piezoelectric ceramic pertaining to this embodiment. The rough composition of the manufacturing process of a piezoelectric ceramic pertaining to this embodiment is explained by referring to FIG. 2, but it should be noted that those portions common to a configuration generally used for ceramic manufacturing processes are not explained as deemed appropriate, with a composition specific to the art of the present invention explained in detail later on.

First, a weighing step is performed (S1). In the weighing step, $SrCO_3$, $CaCO_3$, $Na_2CO_3$, $Nb_2O_5$ and $MnCO_3$ are used as material powders, where the ratio of metal elements is adjusted to the target stoichiometric ratio of the composition formula. Next, a mixing step is performed where the weighed material powders are mixed (S2). In the mixing step, the material powders and alcohol are sealed in a cylindrical pot and processed by the ball mill method for 24 hours. Next, a drying step is performed where the mixed material powders are dried (S3). In the drying step, alcohol is evaporated using a dry oven, etc. This way, a mixed powder constituted by uniformly mixed material powders is obtained.

Next, a calcining step is performed to cause the mixed powder to react (S4). In the calcining step, the mixed powder is put in a crucible and heated in air under a temperature condition of 1170° C. or above and 1210° C. or below for 2 hours or more but 12 hours or less. After the calcining step, powder grains clung to each other partially in the crucible. Accordingly, a crushing step is performed to crush powders obtained after the calcining step (S5). In the crushing step, the ball mill method was used in alcohol just like in the above mixing step (S2). Thereafter, a drying step (S6) is performed using a dry oven, etc., in the same manner as with the above drying step (S3). This way, a calcined powder is obtained.

Next, a binder mixing step is performed where PVA (polyvinyl alcohol) or other binder is added to the calcined powder (S7). At this time, a $SiO_2$ powder is added. The $SiO_2$ powder and binder are uniformly mixed into the calcined powder, and then a sieve, etc., is used to granulate the mixture to obtain a granulated powder. This is followed by a molding step where the granulated powder is molded into a disk shape by the single-axis pressurization method (S8). Next, a binder removal step is performed where the obtained molding is heated under a temperature condition of 350° C. or above and 450° C. or below to remove the binder (S9). Thereafter, a sintering (final sintering) step is performed (S10). The sintering step involves heat treatment in air under a temperature condition of 1200° C. or above and 1240° C. or below for 2 hours.

A piezoelectric ceramic pertaining to this embodiment is completed through the above steps.

[Orientation of Crystal]

A tungsten bronze structure is known to have crystal anisotropy. With the piezoelectric ceramic pertaining to this embodiment, the tungsten bronze phase is oriented to axis c.

(Axis-c Orientation Process)

The manufacturing process of the piezoelectric ceramic pertaining to this embodiment contains a process to orient the tungsten bronze phase to axis c. To be specific, the tungsten bronze phase is oriented to axis c using the method described below.

(a) Strong magnetic field method

The strong magnetic field method adopted by this embodiment is a general method whereby the weak magnetic anisotropy of a dielectric ceramic or piezoelectric ceramic is utilized to orient the crystal grains of the ceramic (align the orientation of crystal grains). This method relates to the binder mixing step (S7) and molding step (S8) in the manufacturing process shown in FIG. 2.

First, the $SiO_2$ powder, PVA, and dispersant are added to the calcined powder obtained after the drying step (S6), after which pure water is used to wet-mix the ingredients under the ball mill method to prepare a slurry of calcined powder. This slurry is poured into a Teflon (registered trademark) container and dried in a rotary magnetic field of 10 tesla under a temperature condition of 15° C. or above and 25° C. or below, to perform casting mold (slip-casting). This way, a molding of 5 mm to 10 mm in thickness is obtained. This is followed by the binder removal step (S9) and sintering step (S10).

Figure 3:
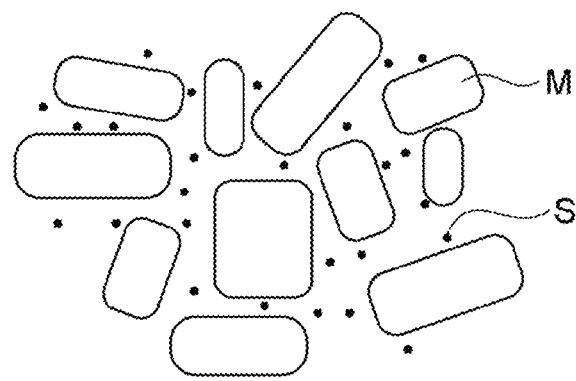
[FIG. 3] is a schematic drawing showing the manufacturing process of a piezoelectric ceramic shown in FIG. 1(a).
Figure 3:
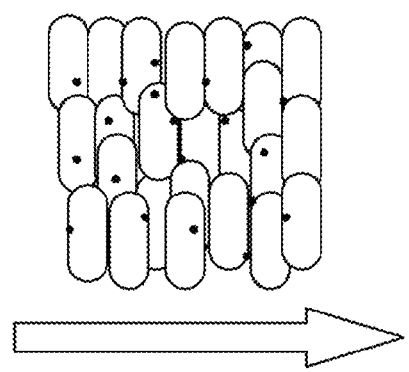
Figure 3:
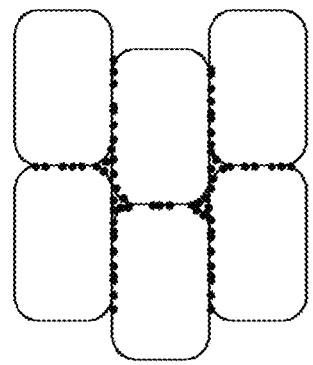

FIG. 3 is a schematic drawing showing the (a) slurry of calcined powder, (b) calcined powder in the casting mold, and (c) the piezoelectric ceramic after the sintering step, in this embodiment.

In FIG. 3, the vertical direction defines the depth direction of the Teflon (registered trademark) container. In other words, the vertical direction in FIG. 3 represents the thickness direction of the piezoelectric ceramic. As for the rotary magnetic field in FIG. 3(b), a magnetic field extending in the direction indicated by the block arrow orthogonal to the depth direction of the Teflon (registered trademark) container is applied, while rotation is added to the Teflon (registered trademark) container along a plane orthogonal to its depth direction, to form the rotary magnetic field.

As shown in FIG. 3(a), the tungsten bronze phase (M) and $SiO_2$ phase (S) are uniformly dispersed in the slurry of calcined powder. As shown in FIG. 3(b), the tungsten bronze phase (M) moves in the rotary magnetic field so that axis c is oriented in the direction orthogonal to the direction of the magnetic field. Since the $SiO_2$ phase (S) does not have magnetism, it is uniformly dispersed in the tungsten bronze phase (M). As shown in FIG. 3(c), crystal grains of the tungsten bronze phase (M) grow slightly after the sintering step, and a piezoelectric ceramic is obtained as dense polycrystal of the tungsten bronze phase (M).

Figure 4:
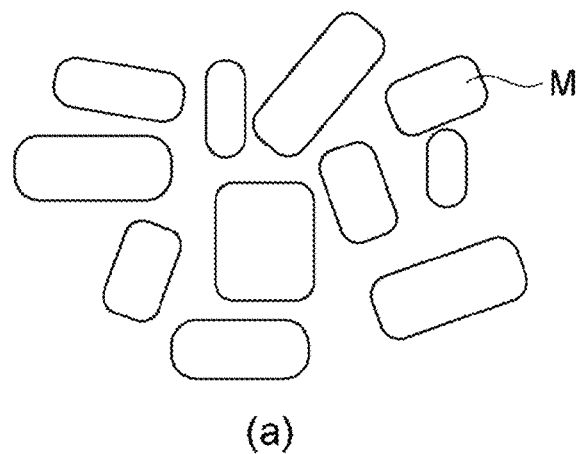
[FIG. 4] is a schematic drawing showing the manufacturing process of a piezoelectric ceramic pertaining to a comparative example of the present invention.
Figure 4:
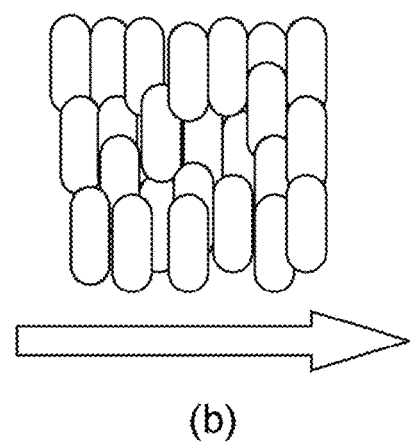
Figure 4:
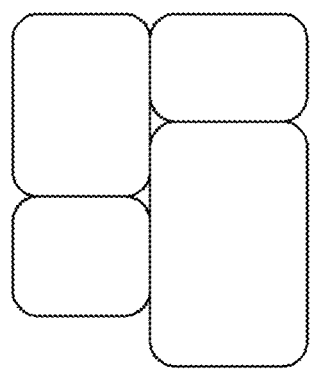

FIG. 4 is a schematic drawing showing the (a) slurry of calcined powder, (b) calcined powder in the rotary magnetic field, and (c) piezoelectric ceramic after the sintering step, in a comparative example of this embodiment. $SiO_2$ phase (S) is not contained in this comparative example.

$SiO_2$ phase (S) is not added to the slurry of calcined powder shown in FIG. 4(a), and the tungsten bronze phase (M) is uniformly dispersed. As shown in FIG. 4(b), the tungsten bronze phase (M) in the rotary magnetic field moves so that axis c is oriented in the direction orthogonal to the direction of the magnetic field. As shown in FIG. 4(c), crystal grains in the tungsten bronze phase (M) grow and become coarse after the sintering step.

Generally with oriented ceramics, crystal grains tend to grow in the direction of its orientation at the time of sintering. In this embodiment, however, the $SiO_2$ phase (S) is dispersed at the grain boundary of the tungsten bronze phase (M), as shown in FIG. 3(c). This way, crystal grains in the tungsten bronze phase of the piezoelectric ceramic pertaining to this embodiment can be prevented from becoming coarse, and a dense structure is obtained as a result.

Figure 5:
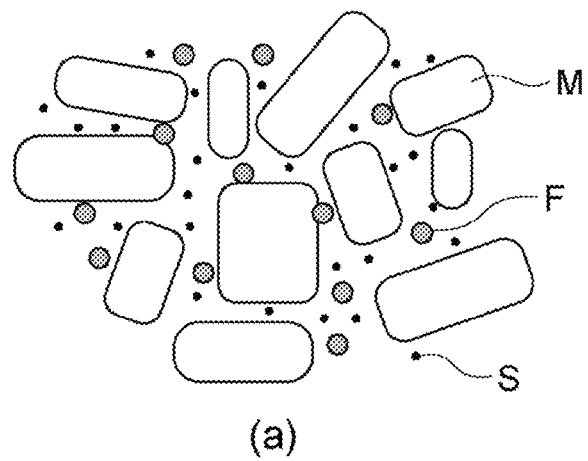
[FIG. 5] is a schematic drawing showing the manufacturing process of a piezoelectric ceramic pertaining to a comparative example of the present invention.
Figure 5:
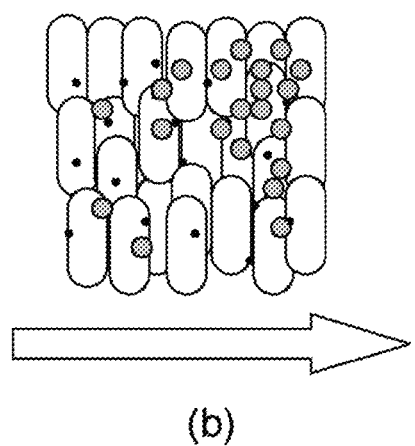
Figure 5:
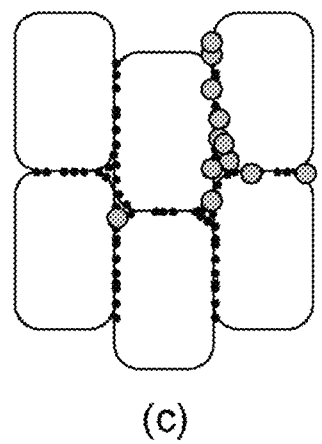

FIG. 5 is a schematic drawing showing the (a) slurry of calcined powder, (b) calcined powder in the rotary magnetic field, and (c) piezoelectric ceramic after the sintering step, in a comparative example of this embodiment. An impurity phase (F) whose main constituent is Mn oxide is contained in this comparative example.

The slurry shown in FIG. 5(a) contains an impurity phase (F) whose main constituent is Mn oxide, and the tungsten bronze phase (M) and impurity phase (F) are uniformly dispersed. As shown in FIG. 5(b), the tungsten bronze phase (M) in the rotary magnetic field moves so that axis c is oriented in the direction orthogonal to the direction of the magnetic field. On the other hand, Mn has magnetism and the impurity phase (F) moves to the direction of the magnetic field as a result. To be more specific, the concentration of the impurity phase (F) in the slurry in the rotating Teflon (registered trademark) container increases toward the outer periphery. This is why the impurity phase (F) is segregated even after the sintering step, as shown in FIG. 5(c).

EDS (energy dispersive X-ray spectrometry) analysis was conducted regarding the concentration difference of Mn element between the center and outer periphery of the sintered ceramic shown in FIG. 5(c). As a result, the concentration of Mn element in this ceramic was at least 40% higher at the outer periphery than at the center. This confirms that an impurity phase (F) whose main constituent is Mn-containing oxide is segregated in this ceramic.

In this embodiment, it was found that adding Mn to the composition $(Sr_{2-x}Ca_x)_{1+y/4}Na_{1-y}NbO_{15}$ would facilitate the production of impurity phase (F) whose main constituent is Mn-containing oxide.

In this embodiment, therefore, the B site of the tungsten bronze phase is adjusted to $(Nb_{5-2/5z}Mn_z)$, instead of adding Mn, replacing Nb with Mn and thereby allowing Mn to enter the B site of the tungsten bronze phase. This is why production of impurity phase (F) whose main constituent is Mn oxide is suppressed in this embodiment. To be specific, the reflection intensity of the main peak of Mn oxide is less than 1 when the reflection intensity of the main peak of the tungsten bronze phase is 100 under the XRD method. Examples of Mn oxide include MnO, $Mn_2O_3$ and $Mn_3O_4$. This is why the piezoelectric ceramic pertaining to this embodiment can achieve a uniform structure even when the strong magnetic field method is used.

The degree of orientation of axis c of the tungsten bronze phase can be controlled by the magnetic field intensity, temperature condition during application of magnetic field, and so on.

(b) Plastic Working Method

The tungsten bronze phase can also be oriented to axis c by a plastic working method using the crystal anisotropy of the tungsten bronze phase. Examples of such plastic working method include the hot forging method and extrusion method.

Under the hot forging method, for example, the molding is deformed in the pressurization direction by means of single-axis pressurization while being heated in the sintering step (S10) in FIG. 2. This way, axis c of the tungsten bronze phase faces the direction orthogonal to the pressurization direction. As a result, the tungsten bronze phase is oriented to axis c, and at the same time the piezoelectric ceramic is sintered in this condition.

Under the extrusion method, for example, the molding is pressed while being heated in the sintering step (S10) in FIG. 2, and the ceramic is extruded out of an opening whose diameter is smaller than the molding. This way, axis c of the tungsten bronze phase faces the extrusion direction. As a result, the tungsten bronze phase is oriented to axis c, and at the same time piezoelectric ceramic is sintered in this condition.

(Evaluation of Degree of Orientation)

With the piezoelectric ceramic pertaining to this embodiment, the degree of orientation of axis c of the tungsten bronze phase is 60% or more in Lotgering factor f. The value of Lotgering factor f is calculated by the Lotgering method. Under the Lotgering method, the degree of orientation is evaluated using reflection intensity data (spectrum) obtained by the XRD method. To evaluate a ceramic oriented with respect to axis c, the total sum of reflection intensities on all surfaces orthogonal to axis c (001) is evaluated.

To evaluate the degree of orientation of a ceramic oriented with respect to axis c using the Lotgering method, reflection intensity data of a non-oriented ceramic and reflection intensity data of a ceramic oriented with respect to axis c are needed.

First, $P_0$ is calculated with Formula (1) below using the total sum $\Sigma I_0$ (hkl) of reflection intensities $I_0$(hkl) on all surfaces obtained from the reflection intensity data of a non-oriented ceramic and the total sum $\Sigma I_0$ (001) of reflection intensities $I_0$ (001) on (001) surfaces:

$$P_0 = \Sigma I_0 (001) / \Sigma I_0 (hkl) \quad (1)$$

Next, P is calculated with Formula (2) below using the total sum $\Sigma I$ (hkl) of reflection intensities I (hkl) on all surfaces obtained from the reflection intensity data of a ceramic oriented with respect to axis c and the total sum $\Sigma I$ (001) of reflection intensities I (001) on (001) surfaces:

$$P = \Sigma I (001) / \Sigma I (hkl) \quad (2)$$

By using $P_0$ and P above, the Lotgering factor f representing the degree of orientation of axis c of the ceramic oriented with respect to axis c can be calculated using Formula (3) below:

$$f = 100 \times (P - P_0)/(1 - P_0) \quad (3)$$

(Correlation of Degree of Orientation and Ferroelastic Phase Transition Temperature)

The ferroelastic phase transition temperature of each ceramic was evaluated using the temperature characteristics of its dielectric constant. Evaluation of the temperature characteristics of the dielectric constant used the impedance analyzer, described later, and the frequency condition was set to 1 kHz. To be specific, the inflection point in ferroelastic phase transition temperature was indicated as the temperature characteristics of the dielectric constant of each ceramic, and the corresponding temperature was used as the ferroelastic phase transition temperature. Instead of using the temperature characteristics of dielectric constant, ferroelastic phase transition temperature can also be evaluated using any generally used method, such as differential scanning calorimetry. In this case, too, ferroelastic phase transition temperatures similar to those which can be obtained from the evaluation of temperature characteristics of dielectric constant can be obtained.

Figure 6:
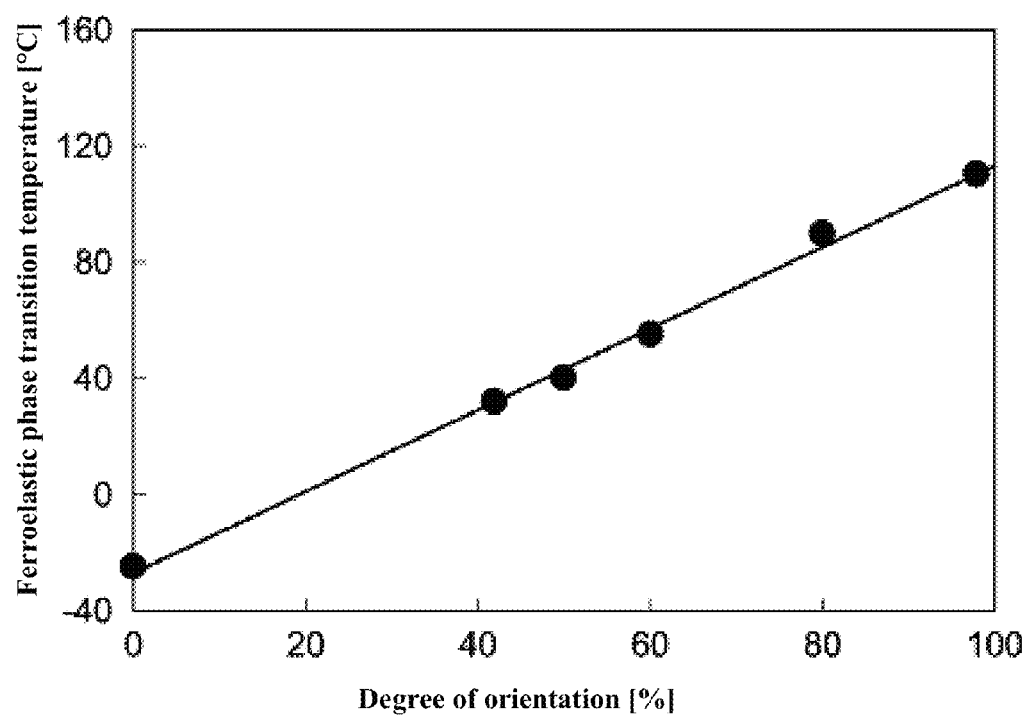
[FIG. 6] is a graph showing the dependence of ferroelastic phase transition temperature on degree of orientation.

FIG. 6 is a graph showing the correlation between the degree of orientation and ferroelastic phase transition temperature of the tungsten bronze phase. It is known that, with non-oriented ceramics constituted by a general tungsten bronze phase, ferroelastic phase transition occurs at −40° C. to 10° C. whereby the tungsten bronze phase changes from the orthorhombic system (2 mm) to tetragonal system (4 mm) (refer to Appl. Phys. Lett., 80 (5) 835-837, (2002)). In this embodiment, it was fond that the ferroelastic phase transition temperature of the tungsten bronze phase was strongly dependent on the degree of orientation of the tungsten bronze phase.

To be specific, the ferroelastic phase transition temperature of the tungsten bronze phase rises linearly as the degree of orientation of the tungsten bronze phase increases. In addition, single crystal of tungsten bronze structure is known to have its ferroelastic phase transition temperature near 100° C. (refer to Mat. Res. Bull., Vol. 23, P1459-1467, (1998)), which means that the ferroelastic phase transition temperature of the piezoelectric ceramic under this embodiment, where the degree of orientation of the tungsten bronze phase is 98%, is near that of single crystal.

As is evident from FIG. 6, the piezoelectric ceramic pertaining to this embodiment is such that there is a linear relationship between the degree of orientation and ferroelastic phase transition temperature of its tungsten bronze phase. With this piezoelectric ceramic, therefore, the ferroelastic phase transition temperature can be calculated from the degree of orientation, or the opposite is also true in that the degree of orientation can be calculated from the ferroelastic phase transition temperature.

With the piezoelectric ceramic pertaining to this embodiment, the degree of orientation of 60% or more for the tungsten bronze phase is set as a condition; however, this condition is virtually equivalent to the condition of 50° C. or above for the ferroelastic phase transition temperature of the tungsten bronze phase.

[Piezoelectric Characteristics]

(Temperature Characteristics of Piezoelectric Constant d and Electro-mechanical Coupling Coefficient k)

First, the piezoelectric constant d and electro-mechanical coupling coefficient k were evaluated as important performance indicators of the piezoelectric ceramics. The piezoelectric constant d is a coefficient that associates mechanical effect and electrical effect. The electro-mechanical coupling coefficient k is a coefficient representing the electrical-mechanical conversion capability, defined by the square root of the ratio of mechanical energy generated to electrical energy given, or by the square root of the ratio of electrical energy generated to mechanical energy given.

How measurement samples were prepared for the measurement of piezoelectric characteristics (piezoelectric constant d and electro-mechanical coupling coefficient k) is explained.

First, Ag paste was applied to the two opposing faces, in the thickness direction, of the piezoelectric ceramic completing the sintering step (S10), and the Ag paste was baked at 800° C. This way, Ag electrodes were formed on the piezoelectric ceramic. This resulting piezoelectric ceramic was immersed in insulating oil at 170° C., and in this condition an electric field of 4 kV/mm was applied for 15 minutes between the Ag electrodes for polarization. This resulted in a polarized piezoelectric ceramic.

Samples of two different shapes were cut out by means of dicing from the polarized piezoelectric ceramic. To be specific, the two types of samples included those of a square column shape (2 mm in length×2 mm in width×5 mm in thickness) and those of a rectangular sheet shape (12 mm in length×3 mm in width×1 mm in thickness). The aforementioned Ag electrodes had been cut from each sample by means of dicing. Accordingly, Ag electrodes were formed again on each sample. To be specific, resin Ag paste was applied to the two opposing faces, in the thickness direction, of each sample, and the resin Ag paste was heated to 150° C. . to be hardened, to form Ag electrodes.

With the samples, the orientation direction of the tungsten bronze phase corresponded to the thickness direction. Samples with degrees of orientation of 0% (non-orientated), 40%, 50%, 60%, 80% and 98% were prepared. Square column samples served as resonators for the measurement of longitudinal vibration (longitudinal mode) in the thickness direction as part of piezoelectric characteristics, while rectangular sheet samples served as resonators for the measurement of stretch vibration (lateral mode) in the length direction as part of piezoelectric characteristics.

Preferably the shape of each sample conforms to JEITA EM-4501, and desirably the samples used in the measurement of longitudinal mode have a circular column shape; in this embodiment, however, they have a square column shape as mentioned above. There are no differences in terms of the rate of change by temperature in piezoelectric characteristics between square column samples and circular column samples, although the absolute values of piezoelectric characteristics are slightly different. The purpose of measurement in this embodiment is to evaluate not the absolute values of piezoelectric characteristics, but their rate of change by temperature; therefore square column samples were used in the measurement of longitudinal mode in this embodiment.

The temperature characteristics of piezoelectric characteristics of each sample were measured using an impedance analyzer (HP-4294A) based on a frequency condition of 1 kHz. The measurement temperature range was −40° C. or above and 150° C. . or below, and the piezoelectric constant d and electro-mechanical coupling coefficient k of each sample were calculated according to JEITA EM-4501 using the resonance-antiresonance frequency and capacitance measured at each temperature.

First, rectangular sheet samples were used to measure the temperature characteristics of piezoelectric constant $d_{31}$ and electro-mechanical coupling coefficient $k_{31}$. Here, the piezoelectric constant $d_{31}$ and electro-mechanical coupling coefficient $k_{31}$ at 25° C. are indicated as the piezoelectric constant $d_{31(25° C.)}$ and electro-mechanical coupling coefficient $k_{31(25° C.)}$, respectively. Also, the maximum values of piezoelectric constant $d_{31}$ and electro-mechanical coupling coefficient $k_{31}$ measured at −40° C. or above and 150° C. or below are indicated as the piezoelectric constant $d_{31(MAX)}$ and electro-mechanical coupling coefficient $k_{31(MAX)}$, respectively. Here, the maximum rates of change relative to the values of piezoelectric constant $d_{31}$ and electro-mechanical coupling coefficient $k_{31}$ at 25° C., or $\Delta d_{31}$ and $\Delta k_{31}$, respectively, are expressed by the formulas (4) and (5) shown below.

$$\Delta d_{31} = 100 \times (d_{31(MAX)} - d_{31(25° C.)}) / d_{31(25° C.)} \tag{4}$$

$$\Delta k_{31} = 100 \times (k_{31(MAX)} - k_{31(25° C.)}) / k_{31(25° C.)} \tag{5}$$

Figure 7:
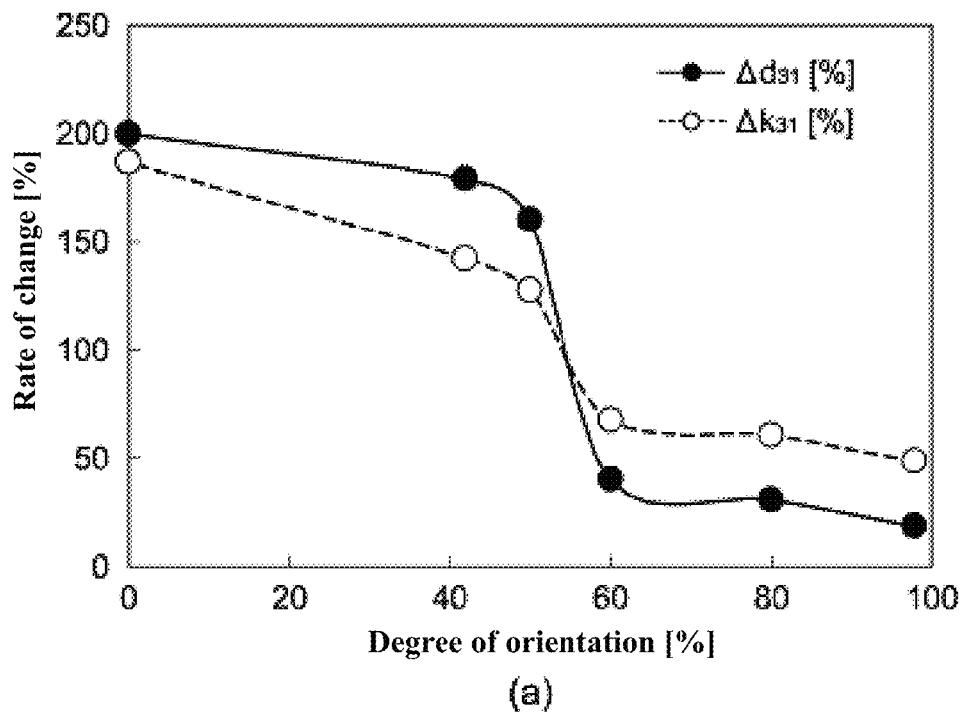
[FIG. 7] is a graph showing the dependence of $\Delta d$ and $\Delta k$ on degree of orientation.
Figure 7:
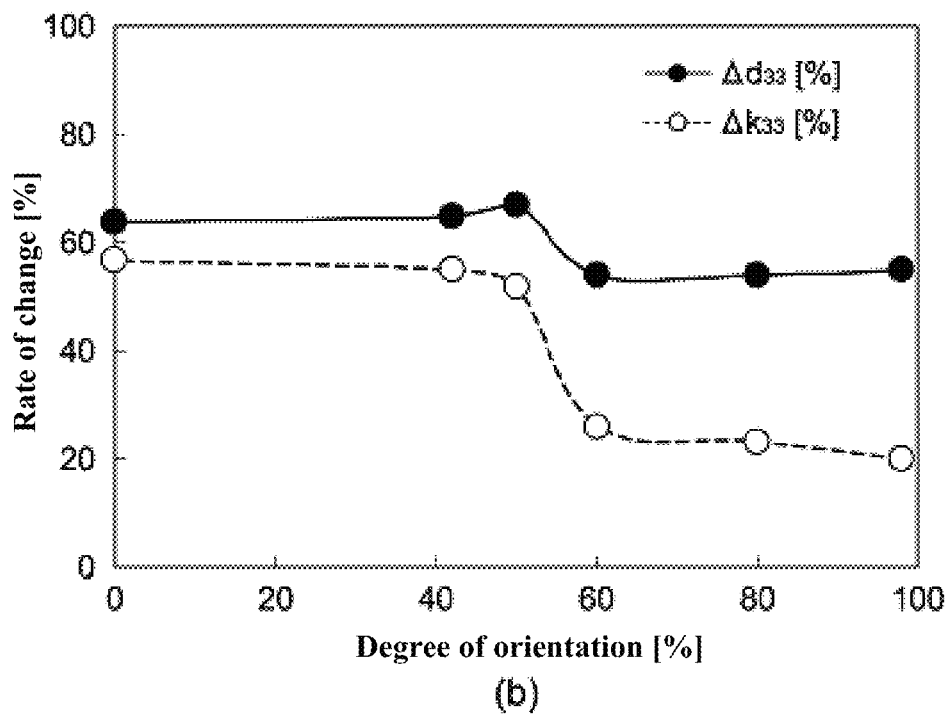

FIG. 7(a) is a graph showing the calculation results of $\Delta d_{31}$ and $\Delta k_{31}$. $\Delta d_{31}$ was very large, or 200%, with the non-oriented sample, and very small, or 18% for the oriented sample with a degree of orientation of 98%. Also, $\Delta d_{31}$ was kept to 40% or less for the samples with a degree of orientation of 60% or more, dramatically smaller than for the samples with a degree of orientation of less than 60%. This indicates that the samples with a degree of orientation of 60% or more had lower temperature dependence of piezoelectric constant $d_{31}$ compared to the samples with a degree of orientation of less than 60%, exhibiting excellent temperature characteristics as a result.

In the meantime, $\Delta k_{31}$ was very large, or 187%, for the non-oriented sample, and small, or 48%, for the sample with a degree of orientation of 98%. Also, $\Delta k_{31}$ was kept to 70% or less for the samples with a degree of orientation of 60% or more, dramatically smaller than for the samples with a degree of orientation of less than 60%. This indicates that the samples with a degree of orientation of 60% or more had lower temperature dependence of electro-mechanical coupling coefficient $k_{31}$ compared to the samples with a degree of orientation of less than 60%, exhibiting excellent temperature characteristics as a result.

Next, square column samples were used to measure the temperature characteristics of piezoelectric constant $d_{33}$ and electro-mechanical coupling coefficient $k_{33}$. Here, the piezoelectric constant $d_{33}$ and electro-mechanical coupling coefficient $k_{33}$ at 25° C. are indicated as the piezoelectric constant $d_{33(25°\ C.)}$ and electro-mechanical coupling coefficient $k_{33(25°\ C.)}$, respectively. Also, the maximum values of piezoelectric constant $d_{33}$ and electro-mechanical coupling coefficient $k_{33}$ measured at −40° C. or above and 150° C. or below are indicated as the piezoelectric constant $d_{33(MAX)}$ and electro-mechanical coupling coefficient $k_{33(MAX)}$, respectively. Here, the maximum rates of change relative to the values of piezoelectric constant $d_{33}$ and electro-mechanical coupling coefficient $k_{33}$ at 25° C., or $\Delta_{33}$ and $\Delta k_{33}$, respectively, are expressed by the formulas (6) and (7) shown below.

$$\Delta d_{33} = 100 \times (d_{33(MAX)} - d_{33(25°\ C.)}) / d_{33(25°\ C.)} \quad (6)$$

$$\Delta k_{33} = 100 \times (k_{33(MAX)} - k_{33(25°\ C.)}) / k_{33(25°\ C.)} \quad ()$$

FIG. 7(b) is a graph showing the calculation results of $\Delta d_{33}$ and $\Delta k_{33}$. $\Delta d_{33}$ was large, or 64%, for the non-oriented sample, and small, or 55%, for the oriented sample with a degree of orientation of 98%. Also, $\Delta d_{33}$ was kept to 60% or less for the samples with a degree of orientation of 60% or more, dramatically smaller than for the samples with a degree of orientation of less than 60%. This indicates that the samples with a degree of orientation of 60% or more had lower temperature dependence of piezoelectric constant $d_{33}$ compared to the samples with a degree of orientation of less than 60%, exhibiting excellent temperature characteristics as a result.

Also, $\Delta k_{33}$ was large, or 57%, with the non-oriented sample, and small, or 20%, for the sample with a degree of orientation of 98%. Also, $\Delta k_{33}$ was kept to 30% or less for the samples with a degree of orientation of 60% or more, dramatically smaller than with the samples with a degree of orientation of less than 60%. This indicates that the samples with a degree of orientation of 60% or more had lower temperature dependence of electro-mechanical coupling coefficient $k_{33}$ compared to the samples with a degree of orientation of less than 60%, exhibiting excellent temperature characteristics as a result.

As explained above, the piezoelectric ceramic pertaining to this embodiment, where the degree of orientation of the tungsten bronze phase is 60% or more, exhibits excellent temperature characteristics of its piezoelectric constant d and electro-mechanical coupling coefficient k.

(High-power Driving Characteristics)

Next, high-power driving characteristics were evaluated. Evaluation of high-power driving characteristics also used samples of the same rectangular sheet shape (12 mm in length×3 mm in width×1 mm in thickness) as with the samples used in the evaluation of piezoelectric constant d and electro-mechanical coupling coefficient k. For the vibration speed of the samples, the effective value at the resonance frequency was used in units of (m/s) instead of (m/s rms) as a matter of convenience.

High-power driving characteristics of samples with degrees of orientation of 0% (non-orientated), 40%, 50%, 60%, 80% and 98% were evaluated. High-power driving characteristics were measured in the continuous driving method. To be specific, each sample was replaced by an equivalent circuit and its equivalent circuit constant was calculated and evaluated. The equivalent circuit constant was calculated by controlling the motional current in the equivalent circuit so that the vibration speed would become constant, and then sweeping the frequency over a range from before to after the first-order longitudinal vibration in the length direction of the sample to draw a dynamic admittance circle.

The vibration speed of the samples was measured using a laser Doppler vibrometer (LV-1300 by Ono Sokki), with the sample temperature measured using a thermocouple fitted in a contact probe (SC 00.15 by Chino). The ambient temperature of the samples was set to 29° C. To be specific, the samples were put in a chamber and the temperature in the chamber was PID-controlled using a heater and Peltier cooler.

With the non-oriented samples, the dynamic admittance circle became small relative to the damping capacitance Cd, and the motional current could not be controlled in a desired manner and high-power driving characteristics could not be measured. When the shape of the non-oriented samples was changed from rectangular sheet to disk, however, high-power driving characteristics could be measured.

The fact that high-power driving characteristics could not be measured with the non-oriented samples of rectangular sheet shape, but could be measured with the non-oriented samples of disk shape, indicates that probably vibration in the length direction was suppressed on the non-oriented samples of rectangular sheet shape as the samples were restrained in the width direction, but not when the shape was a disk.

High-power driving characteristics could be measured in a favorable manner with each oriented sample of rectangular sheet shape. In this embodiment, oriented samples of rectangular sheet shape and non-oriented samples of disk shape were compared. Since the rectangular sheet samples and disk samples are both subject to the lateral mode where the direction of applied electrical field is orthogonal to the direction of vibration, their modes are considered similar, although the shapes are different. Accordingly, comparing high-power driving characteristics using both samples is appropriate.

Figure 8:
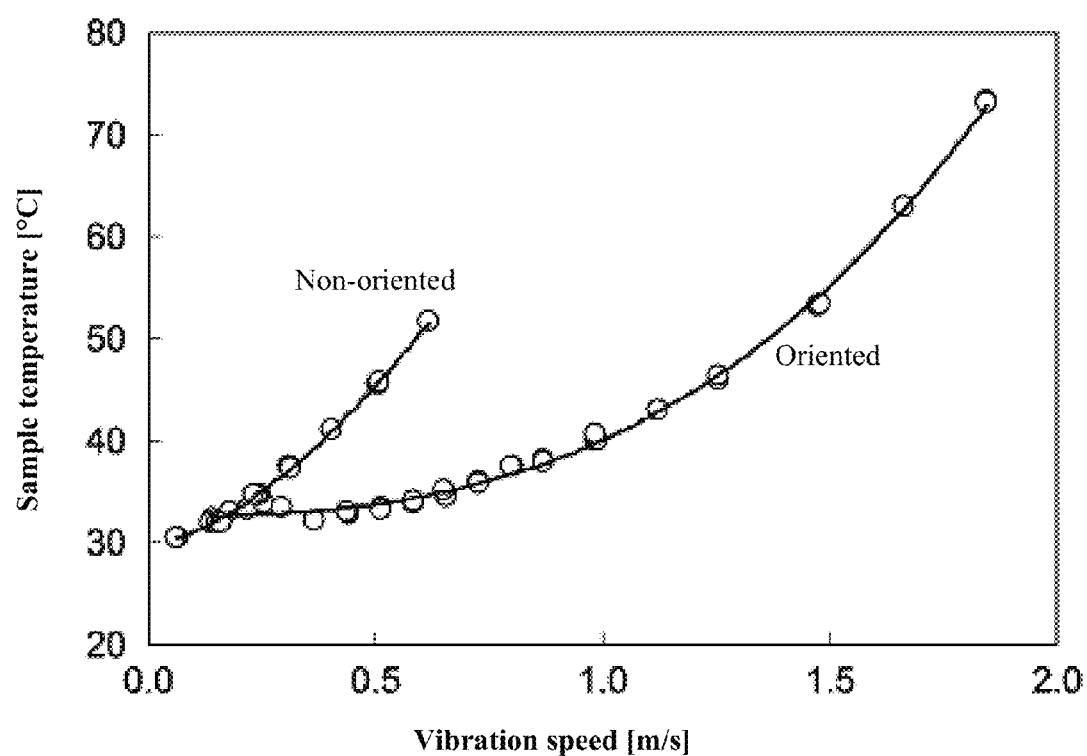
[FIG. 8] is a graph showing the dependence of sample temperature on vibration speed.

FIG. 8 is a graph showing the vibration speed dependence of sample temperature, measured on the non-oriented samples and oriented samples with a degree of orientation of 98%. The maximum vibration speed of the non-oriented samples was 0.62 m/s, while the maximum vibration speed of the oriented samples was 1.84 m/s. As shown, the oriented samples could be driven at significantly higher vibration speeds than the non-oriented samples could. Furthermore, the rise in sample temperature due to vibration speed was more gradual with the oriented samples compared to the non-oriented samples.

Figure 9:
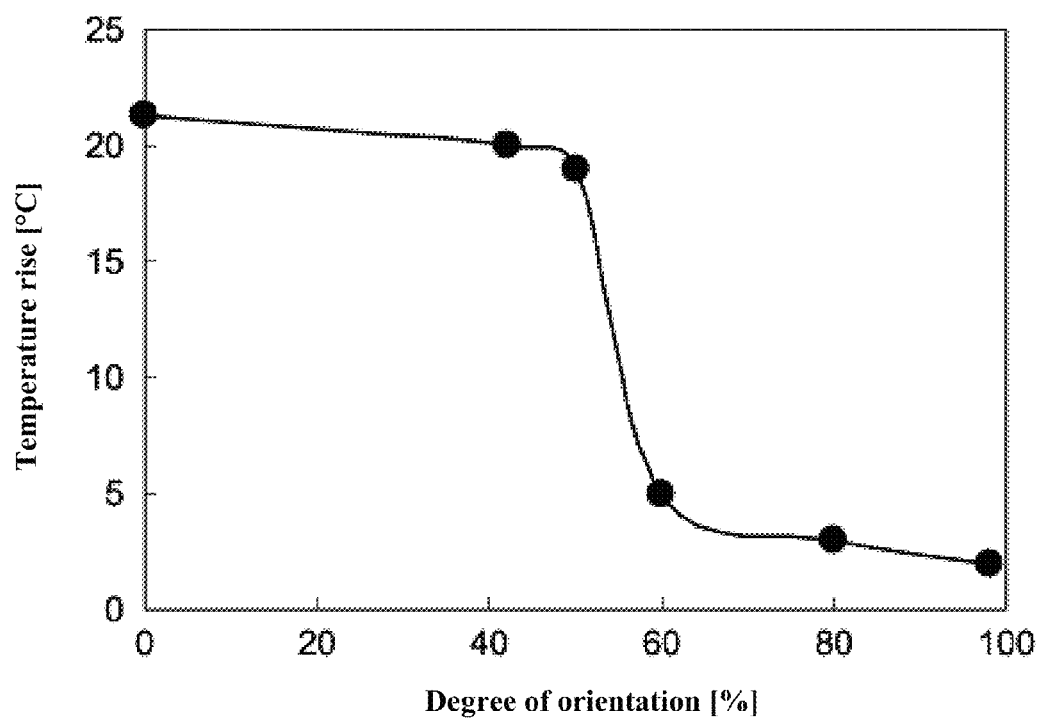
[FIG. 9] is a graph showing the dependence of rise in sample temperature on degree of orientation.

FIG. 9 is a graph showing the amount of rise in temperature, measured on each sample in a non-vibrating state and at varying vibration speeds up to 0.62 m/s. Temperature rose by 8° C. or less on the samples with a degree of orientation of 60% or more, which registered dramatically smaller temperature rises compared to the samples with a degree of orientation of less than 60%. This indicates that the piezoelectric ceramic pertaining to this embodiment, where the degree of orientation of the tungsten bronze phase is 60% or more, is subject to a smaller rise in temperature in a high-power driven state.

Figure 10:
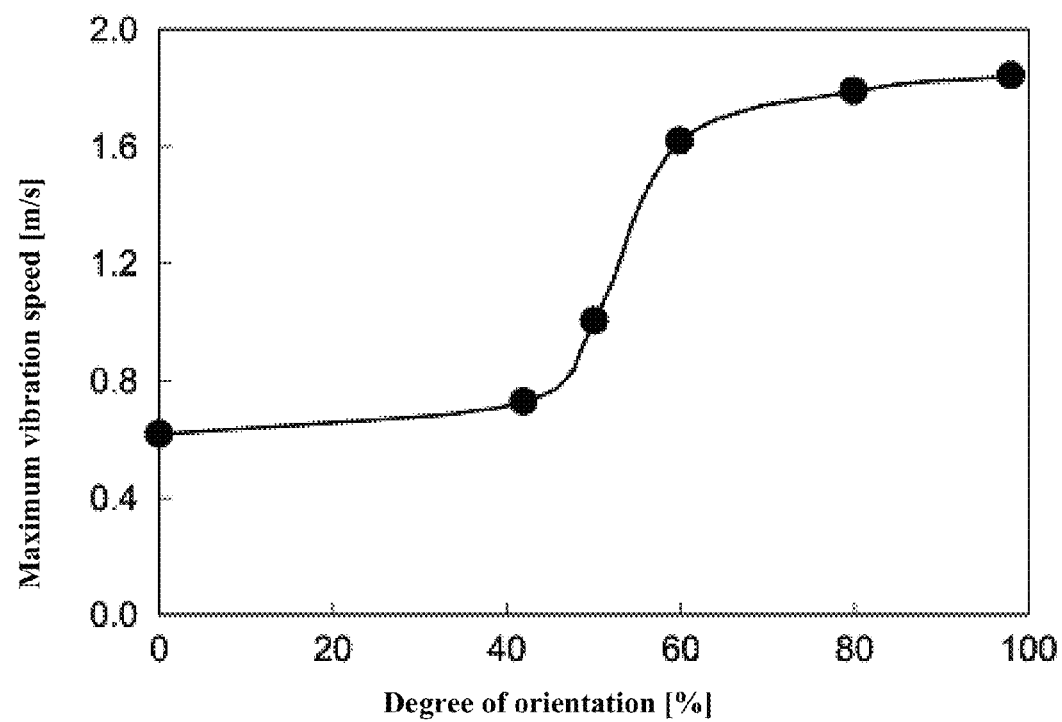
[FIG. 10] is a graph showing the dependence of maximum vibration speed on degree of orientation.

FIG. 10 is a graph showing the maximum vibration speed of each sample. The maximum vibration speed was 1.6 m/s or more for the samples with a degree of orientation of 60% or more, dramatically higher than for the samples with a degree of orientation of less than 60%. As shown, the piezoelectric ceramics with a degree of orientation of 60% or more could be driven at high power at vibration speeds higher than the piezoelectric ceramics with a degree of orientation of less than 60% could.

Next, the mechanical quality coefficient Q was evaluated at high vibration speed. The mechanical quality coefficient Q represents the amount of mechanical loss occurring when the sample vibrates. To be specific, the higher the mechanical quality coefficient Q, the smaller the amount of mechanical loss becomes when the sample vibrates; meaning that the higher the mechanical quality coefficient Q of the sample, the better. A general trend is that the higher the vibration speed, the greater the amount of mechanical loss becomes (which is caused by heat generation from the sample), and the lower the mechanical quality coefficient Q becomes as a result.

Figure 11:
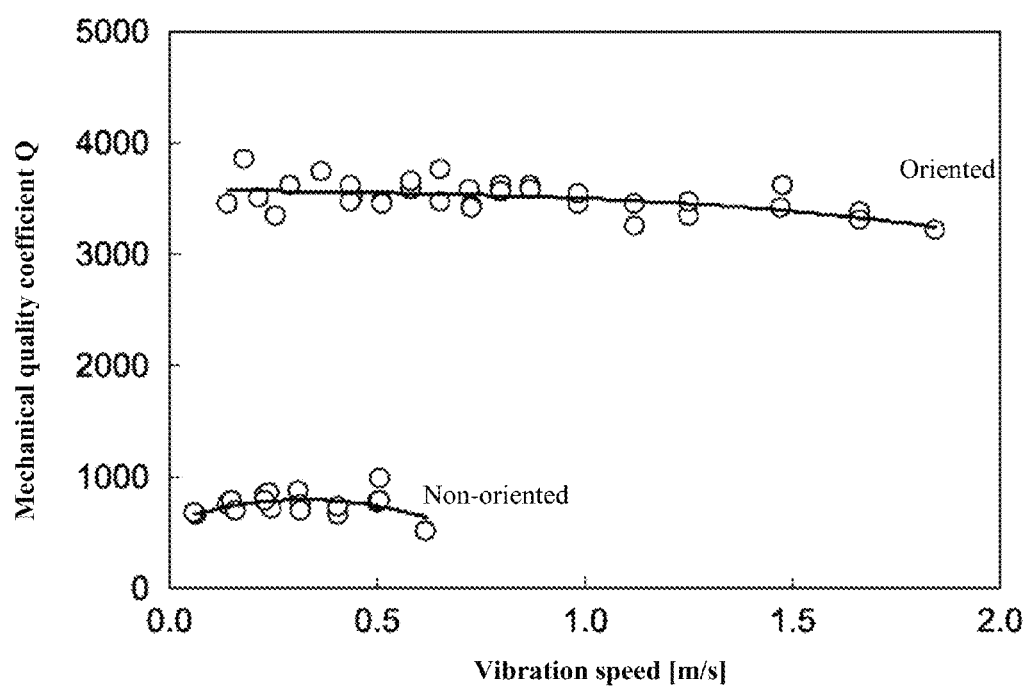
[FIG. 11] is a graph showing the dependence of mechanical quality coefficient Q on vibration speed.

FIG. 11 is a graph showing the vibration speed dependence of mechanical quality coefficient Q, measured on the non-oriented samples and oriented samples with a degree of orientation of 98%. It is understood that the mechanical quality coefficient Q of the oriented samples was very high, or at least three times as high as the mechanical quality coefficient Q of the non-oriented samples. Furthermore, the mechanical quality coefficient Q of the oriented samples was kept high at around 3500, even at high vibration speeds of 1.0 m/s and more.

Figure 12:
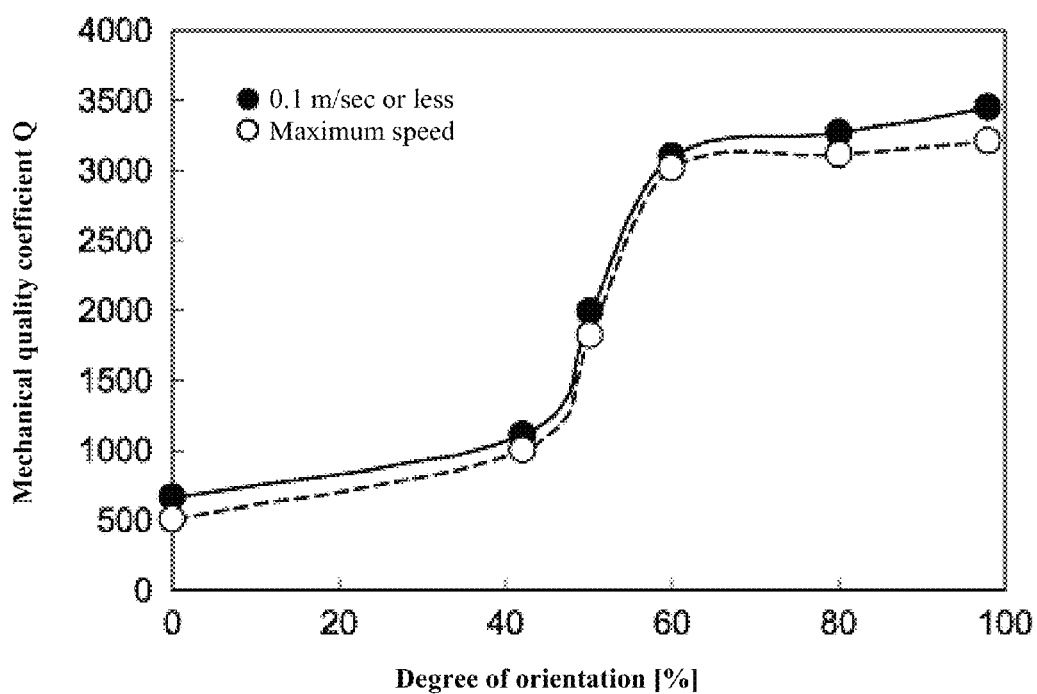
[FIG. 12] is a graph showing the dependence of mechanical quality coefficient Q on degree of orientation.

FIG. 12 is a graph showing the mechanical quality coefficient Q of each sample. FIG. 12 shows the mechanical quality coefficients Q at low vibration speeds of 0.1 m/s and less as the vibration speed is increased from the initial state of vibration (black circles), as well as the mechanical quality coefficients Q at the maximum vibration speeds of respective samples (shown in FIG. 10) (white circles).

Generally the mechanical quality coefficient Q drops as the vibration speed rises, but as shown in FIG. 12, the differences between the mechanical quality coefficients Q at low speeds and mechanical quality coefficients Q at maximum speeds are small. This means that the drop (rate of change) in mechanical quality coefficient Q experienced by each sample as the vibration speed rises is extremely low regardless of the degree of orientation.

Here, when the mechanical quality coefficient Q at the initial stage of vibration (at the start of vibration) is given by $Q_i$ and the mechanical quality coefficient Q at the maximum vibration speed, by $Q_e$, the rate of change in mechanical quality coefficient Q, or $\Delta Q$, can be calculated by Formula (8) below:

$$\Delta Q = 100 \times (Q_e - Q_i)/Q_i \qquad (8)$$

To be specific, the rate of change in mechanical quality coefficient $\Delta Q$ of each sample is kept to 8% or less.

When the relationship of mechanical quality coefficient Q and degree of orientation was examined, Q remained at 3000 or more for the samples with a degree of orientation of 60% or more as long as they were drivable, regardless of the vibration speed, and these levels of Q were dramatically higher than for the samples with a degree of orientation of less than 60%. As shown, the piezoelectric ceramic pertaining to this embodiment, where the degree of orientation of the tungsten bronze phase is 60% or more, saw its mechanical quality coefficient Q increase while being high-power-driven and it could be driven without generating mechanical loss.

Figure 13:
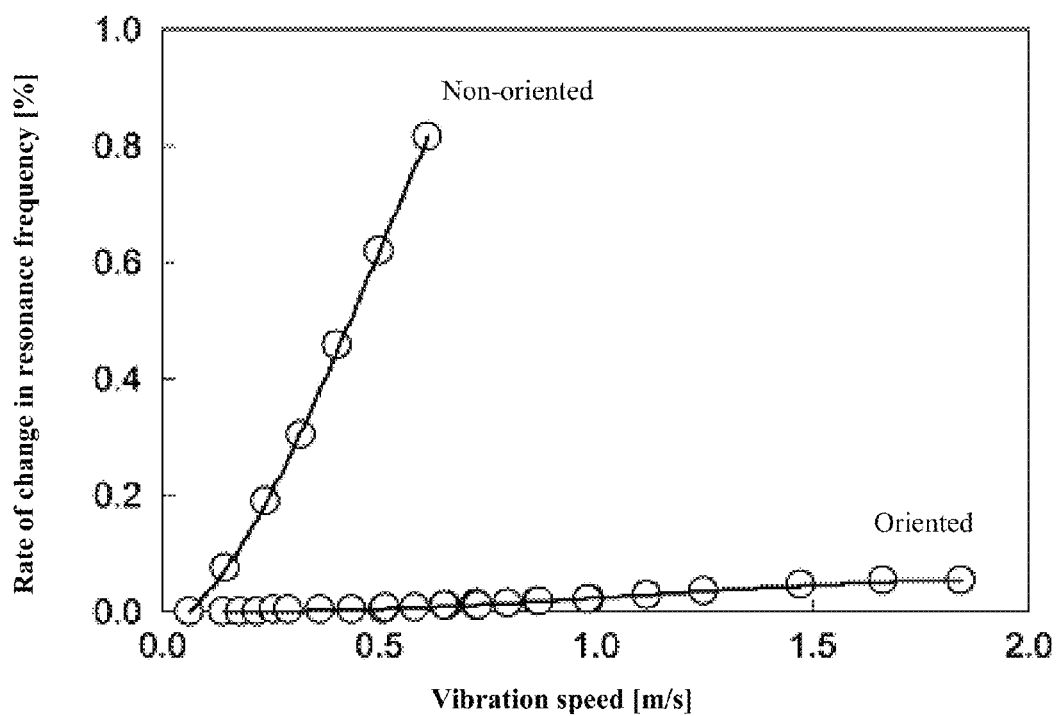
[FIG. 13] is a graph showing the dependence of rate of change in resonance frequency on vibration speed.

FIG. 13 is a graph showing the vibration speed dependence of the rate of change in resonance frequency, measured on the non-oriented samples and oriented samples with a degree of orientation of 98%. The rate of change in resonance frequency was much smaller with the oriented samples compared to the rate of change in resonance frequency of the non-oriented samples. To be specific, while the rate of change was as much as 0.8% with the non-oriented sample at the maximum vibration speed, it was kept to a very small level of 0.05% with the oriented sample at the maximum vibration speed.

Here, when the resonance frequency in the initial state of vibration (at the start of vibration) is given by $f_i$ and resonance frequency at the maximum vibration speed, by $f_e$, the rate of change in resonance frequency $\Delta f$ can be calculated by Formula (9) below:

$$\Delta f = 100 \times (f_e - f_i)/f_i \qquad (9)$$

Figure 14:
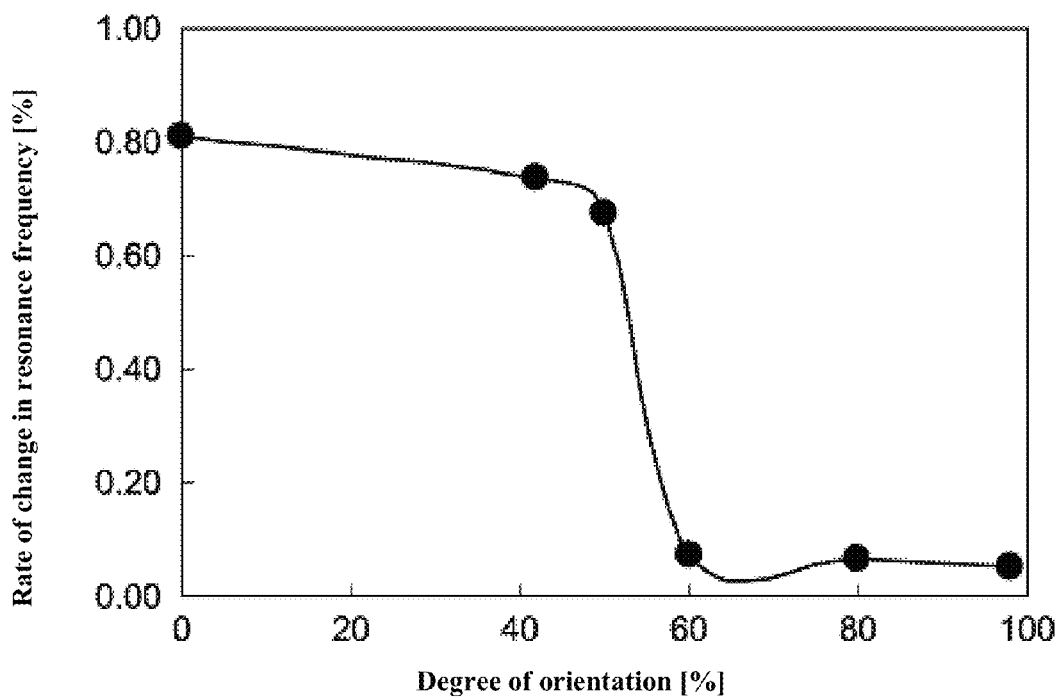
[FIG. 14] is a graph showing the dependence of degree of orientation on resonance frequency at maximum vibration speed of vibration speed.

FIG. 14 is a graph showing the rate of change in resonance frequency experienced by each sample at its maximum vibration speed shown in FIG. 10. The rate of change in resonance frequency is kept to 0.08% or less for the samples with a degree of orientation of 60% or more, dramatically smaller than the samples with a degree of orientation of less than 60%. As shown, the piezoelectric ceramic pertaining to this embodiment, where the degree of orientation of the tungsten bronze phase is 60% or more, is subject to a small rate of change in resonance frequency in a high-power driven state.

Note that, while an example of high-power driving characteristics of the piezoelectric ceramic in the lateral mode was illustrated in this embodiment, results obtained in terms of high-power driving characteristics in the longitudinal mode were similar to the high-power driving characteristics in the lateral mode. This means that the high-power driving characteristics of the piezoelectric ceramic in the longitudinal mode are equivalent to the high-power driving characteristics in the lateral mode explained above, and therefore explanation is omitted in this embodiment.

An embodiment of the present invention was explained above, but it should be noted that the present invention is not at all limited to the aforementioned embodiment and various changes can be added to the extent that they do not deviate from the key points of the present invention.

In this embodiment, $SiO_2$ was added in the binder mixing step (S7) in FIG. 2, but the timing at which to mix $SiO_2$ can be determined as deemed appropriate. For example, $SiO_2$ can be mixed in the mixing step (S2). By using such method, a piezoelectric ceramic similar to that of this embodiment can still be manufactured.

In addition, the intensity of the magnetic field under the strong magnetic field method need not be 10 tesla and can be determined as deemed appropriate. Moreover, it is not necessary to rotate the molding target in the casting mold under the strong magnetic field method, and the molding target may remain stationary.

Furthermore, while the thickness of the molding obtained by the casting mold in this embodiment was defined as 5 mm to 10 mm, the molding can have any desired thickness. Additionally, the molding can be obtained by layering a multiple number of sheets of 10 to 50 um in thickness which have been prepared in the magnetic field in the same manner as in this embodiment.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. In this disclosure, any defined meanings do not necessarily exclude ordinary and customary meanings in some embodiments.

The present application claims priority to Japanese Patent Application No. 2012-111877, filed May 15, 2012, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A piezoelectric ceramic expressed by a composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein a degree of orientation of axis c of the polycrystal is 60% or more in Lotgering factor.

2. A piezoelectric ceramic according to claim 1, wherein a rate of change in piezoelectric constant $d_{31}$ at $-40°$ C. or above and $150°$ C. or below, relative to a value at $25°$ C., is 40% or less.

3. A piezoelectric ceramic according to claim 1, wherein a rate of change in electro-mechanical coefficient $k_{31}$ at $-40°$ C. or above and $150°$ C. or below, relative to a value at $25°$ C., is 70% or less.

4. A piezoelectric ceramic according to claim 1, wherein a rate of change in piezoelectric constant $d_{33}$ at $-40°$ C. or above and $150°$ C. or below, relative to a value at $25°$ C., is 60% or less.

5. A piezoelectric ceramic according to claim 1, wherein a rate of change in electro-mechanical coefficient $k_{33}$ at $-40°$ C. or above and $150°$ C. or below, relative to a value at $25°$ C., is 30% or less.

6. A piezoelectric ceramic according to claim 1, wherein a maximum temperature rise until a vibration speed reaches 0.62 m/s is $8°$ C. or less.

7. A piezoelectric ceramic according to claim 1, wherein a maximum vibration speed is 1.6 m/s or more.

8. A piezoelectric ceramic according to claim 1, wherein a rate of change in mechanical quality coefficient Q within a range of drivable vibration speeds is 8% or less.

9. A piezoelectric ceramic according to claim 1, wherein a difference between maximum and minimum resonance frequencies within a range of drivable vibration speeds is 0.08% of the minimum value or less.

10. A piezoelectric ceramic expressed by a composition formula $100[(Sr_{2-x}Ca_x)_{1+y/4}Na_{1-y}Nb_{5-2/5z}Mn_zO_{15}]+\alpha SiO_2$ (in the formula, $0 \leq x < 0.3$, $0.1 < y < 0.6$, $0 < z < 0.1$ and $1 < \alpha < 8$) and constituted by polycrystal of tungsten bronze structure, wherein a ferroelastic phase transition temperature of the polycrystal is $50°$ C. or above.

11. A piezoelectric ceramic according to claim 10, wherein a rate of change in piezoelectric constant $d_{31}$ at $-40°$ C. or above and $150°$ C. or below, relative to a value at $25°$ C., is 40% or less.

12. A piezoelectric ceramic according to claim 10, wherein a rate of change in electro-mechanical coefficient $k_{31}$ at $-40°$ C. or above and $150°$ C. or below, relative to a value at $25°$ C., is 70% or less.

13. A piezoelectric ceramic according to claim 10, wherein a rate of change in piezoelectric constant $d_{33}$ at $-40°$ C. or above and $150°$ C. or below, relative to a value at $25°$ C., is 60% or less.

14. A piezoelectric ceramic according to claim 10, wherein a rate of change in electro-mechanical coefficient $k_{33}$ at $-40°$ C. or above and $150°$ C. or below, relative to a value at $25°$ C., is 30% or less.

15. A piezoelectric ceramic according to claim 10, wherein a maximum temperature rise until a vibration speed reaches 0.62 m/s is $8°$ C. or less.

16. A piezoelectric ceramic according to claim 10, wherein a maximum vibration speed is 1.6 m/s or more.

17. A piezoelectric ceramic according to claim 10, wherein a rate of change in mechanical quality coefficient Q within a range of drivable vibration speeds is 8% or less.

18. A piezoelectric ceramic according to claim 10, wherein a difference between maximum and minimum resonance frequencies within a range of drivable vibration speeds is 0.08% of the minimum value or less.

19. A method of manufacturing a piezoelectric ceramic, comprising:
    mixing a $SiO_2$ powder with a powder constituted by crystal of tungsten bronze structure expressed by a composition formula $(Sr_{2-x}Ca_x)_{1+y/4}Na_{1-y}Nb_{5-2/5z}Mn_zO_{15}$ (in the formula, $0 \leq x < 0.3$, $0.1 < y < 0.6$ and $0 < z < 0.1$), at a ratio of a mol ($1 < \alpha < 8$) of the $SiO_2$ powder to 100 mol of the powder, to prepare a mixed powder;
    applying a magnetic field to prepare a molding of the mixed powder where orientation has been added to the crystal; and
    sintering the molding to prepare a sintered compact whose degree of orientation of axis c in the above crystal is 60% or more in Lotgering factor.

* * * * *

UNITED STATES PATENT AND TRADEMARK OFFICE
CERTIFICATE OF CORRECTION

PATENT NO. : 8,974,687 B2
APPLICATION NO. : 13/853796
DATED : March 10, 2015
INVENTOR(S) : Hiroyuki Shimizu and Yutaka Doshida Page 1 of 1

It is certified that error appears in the above-identified patent and that said Letters Patent is hereby corrected as shown below:

In the Claims

At column 18, line 46, in Claim 19, in "at a ratio of a mol," please change "a" to "α" so that it will show as "at a ratio of α mol"

Signed and Sealed this
Eleventh Day of August, 2015

Michelle K. Lee
*Director of the United States Patent and Trademark Office*